United States Patent [19]

Sakui

[11] Patent Number: 4,758,987
[45] Date of Patent: Jul. 19, 1988

[54] DYNAMIC SEMICONDUCTOR MEMORY WITH STATIC DATA STORING CELL UNIT

[75] Inventor: Koji Sakui, Tokyo, Japan
[73] Assignee: Kabushiki Kaisha Toshiba, Kawasaki, Japan
[21] Appl. No.: 806,498
[22] Filed: Dec. 9, 1985

[30] Foreign Application Priority Data

Dec. 13, 1984 [JP] Japan ................. 59-263304

[51] Int. Cl.$^4$ ........................................... G11C 7/00
[52] U.S. Cl. ..................... 365/189; 365/203
[58] Field of Search ............. 365/203, 189, 154, 149, 365/222, 228

[56] References Cited

U.S. PATENT DOCUMENTS

| | | | |
|---|---|---|---|
| 3,646,525 | 2/1972 | Linton et al. | 365/149 X |
| 4,004,284 | 1/1977 | Heeren | 365/149 X |
| 4,354,255 | 10/1982 | Stewart | 365/154 |
| 4,363,110 | 12/1982 | Kalter et al. | 365/149 |
| 4,508,980 | 4/1985 | Puar | 365/203 X |
| 4,592,021 | 5/1986 | Suzuki et al. | 365/189 |
| 4,597,059 | 6/1986 | Takemae et al. | 365/189 X |
| 4,628,486 | 12/1986 | Sakui | 365/230 X |
| 4,628,488 | 12/1986 | Saku et al. | 365/230 X |

FOREIGN PATENT DOCUMENTS

49-21448  6/1974  Japan .

*Primary Examiner*—Stuart N. Hecker
*Assistant Examiner*—Alyssa H. Bowler
*Attorney, Agent, or Firm*—Oblon, Fisher, Spivak, McClelland & Maier

[57] ABSTRACT

According to a dynamic random access memory of the invention, memory cell word lines are provided substantially perpendicular to bit lines. Memory cells are provided at intersections of the bit lines and the memory cell word lines. Sense-amplifiers are connected to the bit line pair. Static memory cell are also connected to the bit lines and serves as an auxiliary memory. When a memory cell word line is selected, the static memory cells statically hold data voltages stored in an array of memory cells connected to the selected word line until another word line is selected. Thus, during a pre-charge period of the bit lines, the data voltages can be stored in the static memory cells. Therefore, even during the pre-charge period, data read/write is enabled.

5 Claims, 6 Drawing Sheets

FIG. 2

DYNAMIC SEMICONDUCTOR MEMORY WITH STATIC DATA STORING CELL UNIT

BACKGROUND OF THE INVENTION

The present invention relates to a semiconductor memory device, and, more particularly, to a dynamic random access memory wherein each memory cell comprises one transistor and one capacitor, and data can be randomly read/written.

In the recent computer controlled data processing field, types and amounts of data to be processed are increasing. An important problem is indicated by the strong demand which has arisen for high speed accessing for the data read/write operation. Meanwhile, the memory capacity of a dynamic random access memory (to be referred to as a "dRAM" hereinafter) has been greatly improved in accordance with developments in the micro-patterning technique of memory cell patterns. Thus, a large amount of data can be stored in a single memory device of one chip. As a result, the demand for high speed data accessing of dRAM has increased in strength.

Today, in order to improve the data access speed of dRAM, a large number of data access drive methods have been developed and proposed. For example, a page mode dRAM has been proposed. According to a dRAM of this type, unlike a conventional memory wherein row and column address lines (i.e., word and bit lines) must be reset and pre-charged every time selection of one cell is completed, even after a cell is selected, word lines connected to the selected cell are not reset but are continuously activated. In the readout mode of this dRAM, after a desired cell is selected the word line connected thereto is left activated. Therefore, when another desired cell is designated by using only a bit line from the other cells connected to this word line, high-speed selection can be achieved. As a result, the data access speed of the page mode dRAM can be increased to twice that of a normal mode dRAM.

Furthermore, as a method of improving data access speed, a dRAM can be driven in a nibble mode. Basically, cell selection is performed so that four cells (i.e., 4 bits) connected to intersections between two adjacent word lines and two adjacent bit lines are used as one unit. During cell designation, the two word lines are continuously activated. A desired cell is designated by a shiftregister from the designated four cells. At this time, since no column address clock signal is required, the two bit lines need not be pre-charged in order to designate one desired cell from four cells. Therefore, the data access speed of the dRAM can be further improved as compared to the page mode dRAM.

According to the above dRAMs, however, the precharge operation cannot be completely eliminated from all the operation modes. Yet, presence of a pre-charge period means degradation in improvement in data access speed. This is because during the pre-charge period data accessing cannot be performed, with the pre-charge time undesirably protracting the time needed for data accessing. Therefore, even though the above method is used, data access speed of a dRAM is limited and cannot cope with demand for further improvement. For example, the page mode dRAM requires a precharge operation when data accessing is shifted from one word line to another word line, a pre-charge operation that takes the same period of time as in a normal mode dRAM. In the nibble mode dRAM, when a set (4 bits) of cells is shifted to another set (4 bits) of cells, a pre-charge operation is, likewise, required. Even in a MOS dRAM having a relatively short memory access time, e.g., 100 nano seconds, it takes 100 nano seconds to pre-charge bit lines and a clock generator.

SUMMARY OF THE INVENTION

It is, therefore, an object of the present invention to provide a new and improved dynamic semiconductor memory device which can read/write data during a pre-charge period; therefore greatly improving data access speed.

According to the dynamic semiconductor memory device of the present invention, a plurality of bit lines are formed parallel to each other on a substrate. A plurality of memory cell word lines are provided substantially perpendicular to the bit lines. A memory cell is provided at each intersection between the bit and word lines. Static auxiliary memory cells are connected to the bit lines through transfer gates. When a desired word line is selected, the static auxiliary memory cells receive data voltages stored in the memory cells connected to the selected word line and temporarily and statically hold them. Thus, during the pre-charge period of the bit lines, the data voltages are stored in auxiliary memory cells until another word line is selected. Therefore, during the pre-charge period, arbitrary data in the stored data can be read out or rewritten in the corresponding memory cell. As a result, wasteful standby time in data accessing can be effectively eliminated and operation speed of the dRAM improved.

BRIEF DESCRIPTION OF THE DRAWINGS

The present invention is best understood by reference to the accompanying drawings, in which.

DETAILED DESCRIPTION OF THE PREFERRED EMBODIMENT

An arrangement of a dynamic random access memory (to be referred to as a "dRAM" hereinafter) according to one preferred embodiment of the present invention will be described with reference to FIGS. 1 and 2 (wherein a chip substrate is omitted from these figures for the sake of simplifying the drawings). In this embodiment, the dRAM has a so-called folded-bit-line configuration.

Figure 1:
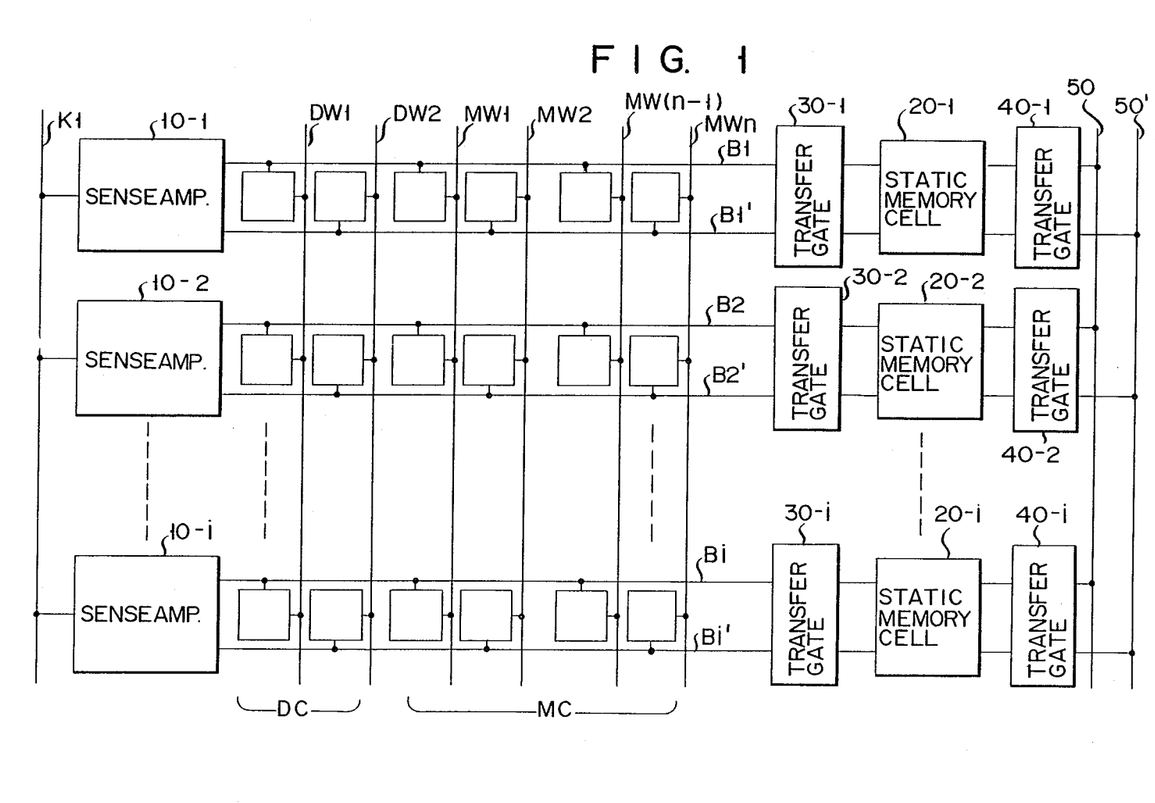
FIG. 1 is a diagram schematically showing the overall plan circuit configuration of a dRAM according to an embodiment of the present invention.

Referring to FIG. 1, a plurality of bit line pairs B1, B1', B2, B2', . . . , Bi, Bi', . . . (although suffixes 1, 2, . .

., i, ... are used to represent numbers of the bit line pairs, they will be omitted in the following description when distinction is not particularly needed) are formed parallel to each other on a substrate. A pair of word lines for dummy cells (to be referred to as "dummy cell word lines" hereinafter) DW1 and DW2 and a plurality of word lines for memory cells (to be referred to as "memory cell word lines" hereinafter) MW1, MW2, ..., MW(n−1), MWn run substantially perpendicular to these bit lines B and B'. Dummy cells DC are provided at intersections between the bit lines B and B' and the dummy cell word lines DW in a known manner. Memory cells MC are provided at intersections between the bit lines B and B' and the memory cell word lines MW in a known manner. Each cell comprises a switching transistor and a capacitor.

Sense-amplifiers 10-1, 10-2, ..., 10-i, ... are connected to the bit line pairs B1, B1', B2, B2', ..., Bi, Bi', ... at first ends thereof. Static memory cells 20-1, 20-2, ..., 20-i are connected to second ends of the bit line pairs B1, B1', B2, B2', ..., Bi, Bi', ... through corresponding first transfer gate sections 30-1, 30-2, ..., 30-i, respectively. As will be described later in detail, each static memory cell 20 comprises a latch memory cell and serves as an auxiliary memory cell. Each static auxiliary memory cell 20 is connected to an input/output line pair 50 and 50' through corresponding second transfer gate sections 40-1, 40-2, ..., 40-i.

Figure 2:
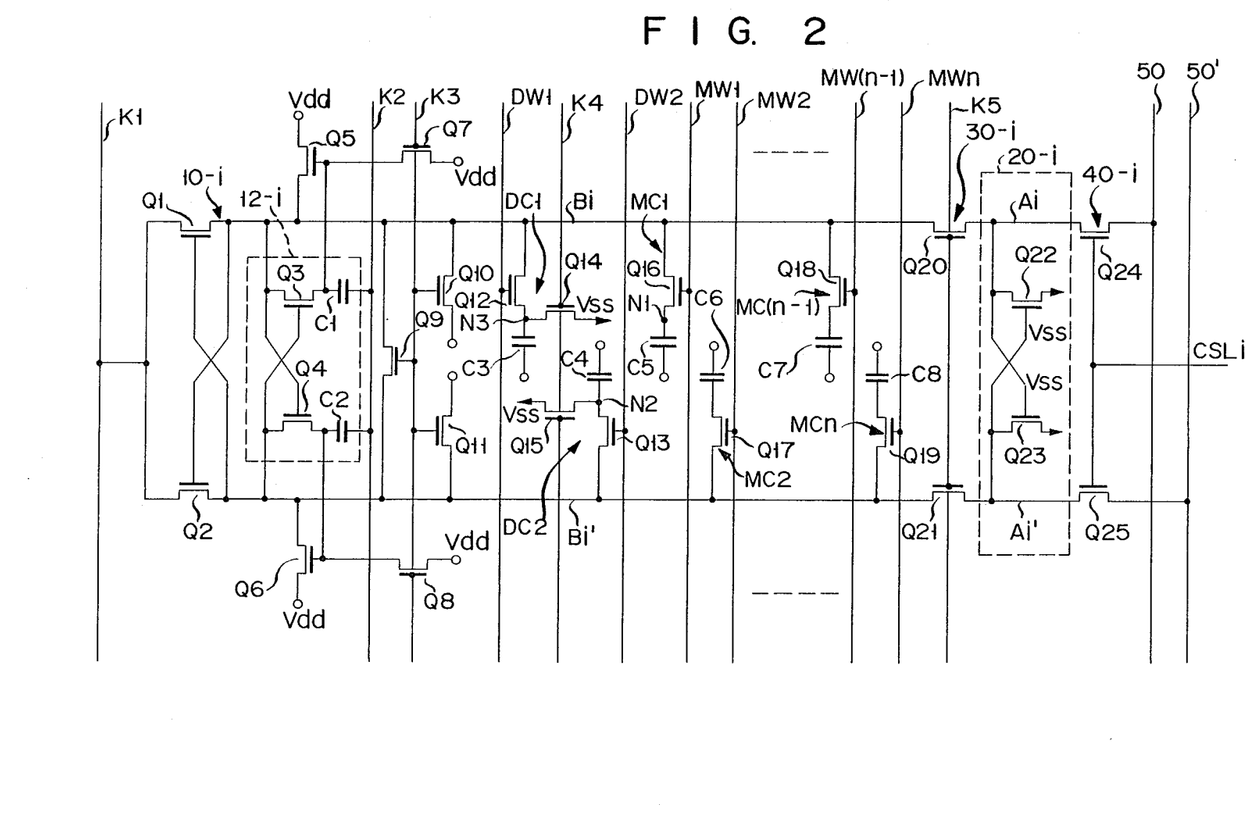
FIG. 2 is a diagram showing, in more detail, a circuit configuration associated with an ith bit line pair of the dRAM of FIG. 1.

Only the ith bit line pair (Bi, Bi') is illustrated in FIG. 2. It should be noted that the other bit line pairs have the same configuration as the ith bit line pair (Bi, Bi').

The sense-amplifier 10-i (to be indicated by "10" hereinafter for the sake of simplicity, something applicable to other components as well) is connected to an ith pair of the bit lines Bi and Bi'. The sense-amplifier 10 includes metal oxide semiconductor field effect transistors (MOSFETs) Q1 and Q2 and a pull-up circuit 12. The MOSFETs Q1 and Q2 are connected to the bit lines Bi and Bi', respectively. The sources of the MOSFETs Q1 and Q2 are commonly connected to each other, and are connected to a sense-clock line K1. In these MOSFETs Q1 and Q2 the gate of one MOSFET is connected to the drain of the other MOSFET, thereby constituting a driver circuit. The pull-up circuit 12 is provided between the bit lines Bi and Bi'. The pull-up circuit 12 includes MOSFETs Q3 and Q4 and pull-up capacitors (MOS capacitors) C1 and C2, corresponding thereto in a known manner. More specifically, a series circuit of the capacitor C1 and the FET Q3 is connected between the bit line Bi and a clock line K2, while a series circuit of the capacitor C2 and the FET Q4 is connected between the other bit line Bi' and the clock line K2. In the FETs Q3 and Q4 the gate of one MOSFET is connected to the drain of the other MOSFET.

The sources of MOSFETs Q5 and Q6 are connected to the bit lines Bi and Bi', respectively. The drains of the MOSFETs Q5 and Q6 are connected to a power supply voltage Vdd so as to serve as an active pull-up load. The gates of the MOSFETs Q5 and Q6 are connected to nodes between the FET-capacitor pairs (i.e., Q3 and C1; Q4 and C2) in the pull-up circuit 12. MOSFETs Q7 and Q8 are provided to switch the gates of the MOSFETs Q5 and Q6 so as to control the pre-charge operation. Therefore, the FET Q7 is connected between the gate of the FET Q5 and the power supply voltage Vdd, while the FET Q8 is connected between the gate of the FET Q6 and the power supply voltage Vdd.

MOSFETs Q9, Q10 and Q11 are provided so as to pre-charge the bit lines Bi and Bi' and to activate the sense-amplifier 10. The gates of the FETs Q9, Q10 and Q11 are connected in common to a pre-charge clock line K3. The clock line K3 is also connected to the gates of the FETs Q7 and Q8. The source and drain of the FET Q9 are connected between the bit lines Bi and Bi'. The sources of the FETs Q10 and Q11 are connected to the bit lines Bi and Bi', respectively, and the drains thereof are connected to the power supply voltage Vdd.

The dummy cell DC1 is provided at an intersection of the dummy cell word line DW1 and the bit line Bi, and the dummy cell DC2 is provided at an intersection of the dummy cell word line DW2 and the bit line Bi'. In the dummy cell DC1, a switching MOSFET Q12 is connected to the dummy cell word line DW1 and the bit line Bi. The data storing capacitor C3 is connected to the source of the MOSFET Q12. In the dummy cell DC2, a switching MOSFET Q13 is connected to the dummy cell word line DW2 and the bit line Bi'. The data storing capacitor C4 is connected to the source of the MOSFET Q13. The MOSFETs Q12 and Q13 of these dummy cells can be selected by the dummy cell word lines DW. The MOSFETs Q12 and Q13 are further connected to the ground potential Vss through MOSFETs Q14 and Q15. The gates of the MOSFETs Q14 and Q15 are connected to the dummy cell clock line K4. Therefore, the MOSFETs Q14 and Q15 are simultaneously selected by a dummy cell clock signal supplied onto the clock line. The potential at reference terminals (illustrated like free terminals in FIG. 2) of the dummy cell capacitors C3 and C4 is set to be equal to the power supply voltage Vdd, the ground potential Vss, or half of the voltage Vdd (i.e., ½ Vdd).

FIG. 2 illustrates four memory cells MC1, MC2, MC(n−1) and MCn provided at intersections of the four memory cell word lines MW1, MW2, MW(n−1) and MWn with respect to the ith bit line pair Bi and Bi'. More specifically, the memory cell MC1 is provided at the intersection of the memory cell word line MW1 and the bit line Bi, and the memory cell MC2 is provided at the intersection of the memory cell word line MW1 and the bit line Bi'. The memory cells MC(n−1) and MCn are connected in the same manner as described above.

Each memory cell MC has a MOSFET and a data storing capacitor, as in a dummy cell. The memory cell MC1 comprises a switching MOSFET Q16 connected to the word line MW1 and the bit line Bi, and a data storing capacitor C5 connected to the MOSFET Q16. The memory cell MC2 comprises a switching MOSFET Q17 connected to the word line MW2 and the bit line Bi', and a data storing capacitor C6. The memory cells MC(n−1) and MCn respectively comprise MOSFETs Q18 and Q19 and capacitors C7 and C8, which are connected in the same manner as described above. The power supply voltage Vdd, ground potential Vss or half of the voltage Vdd (i.e., ½ Vdd) is applied to reference potential terminals (illustrated like free terminals in FIG. 2) of the capacitors C5 to C8.

The latch memory cell 20 serves as an auxiliary memory cell for statically holding a data voltage. (The above-mentioned memory cell MC can be called a dynamic memory cell so as to distinguish it from the static memory cell 20, as needed.) The latch memory cell 20 is connected to the bit lines Bi and Bi', constituting the ith bit line pair, through the first transfer gate section 30-i. The latch memory cell 20 comprises a static flip-flop circuit as in other latch memory cells (not shown). As shown in FIG. 2, a pair of lines Ai and Ai' are connected to the bit lines Bi and Bi' through MOSFETs Q20 and Q21, constituting a transfer gate 30. The gates of the MOSFETs Q20 and Q21 are connected to a clock line K5. Since the line K5 is supplied with a transfer gate drive clock signal, the MOSFETs Q20 and Q21 are controlled in response to this clock signal. The flip-flop circuit is provided between the lines Ai and Ai'. The flip-flop circuit is comprised of two connected MOSFETs Q22 and Q23, as shown in FIG. 2. The gate of one of the MOSFETs Q22 and Q23 is connected to the drain of the other FET. The sources of the MOSFETs Q22 and Q23 are grounded. The drains of the MOSFETs Q22 and Q23 are connected to the lines Ai and Ai', respectively.

The second transfer gate section 40-i is provided at the stage next to the latch memory cell 20 (this also applies to other second transfer gate sections). The second transfer gate 40 has two MOSFETs Q24 and Q25. The MOSFET Q24 is connected between the line Ai and a signal input/output line 50, and the MOSFET Q25 is connected between the line Ai' and a signal input/output line 50'. The gates of the FETs Q24 and Q25 are connected in common to each other, and are connected to a corresponding ith column select line CSLi.

The operation mode of the dRAM, according to the embodiment of the present invention with the above configuration, will be described with reference to FIGS. 3A to 3T and 4A to 4T.

First, a normal data access operation and an operation for transferring data stored in a desired latch memory cell onto the input/output lines 50 and 50' during the pre-charge period of the bit lines will be described with reference to FIGS. 3A to 3T. In the data access mode of the dRAM, since the voltage level of the clock line K3 is set at 3/2 Vdd when data is initially read out from the desired cell, all the bit lines B and B' are pre-charged. The ith bit line pair Bi and Bi' (see FIG. 2) will be exemplified. Assuming that the memory cell capacitor C5 stores bit data at logic level "1", the node N1 of the capacitor C5 is held at the voltage Vdd by this data storage (FIG. 3T). The node N2 of the dummy cell capacitor is held at the voltage Vss (FIG. 3S). Assuming that the latch memory cell 20 stores bit data at logic level "0", initial potentials of the node lines Ai and Ai' are set at Vss and Vdd, respectively.

Figure 3A:
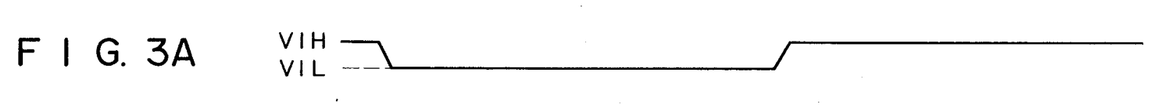
FIGS. 3A to 3T are waveform charts showing electrical signals which are generated from main parts or supplied thereto when a normal data access operation and an operation for transferring data stored in a desired latch memory cell onto input/output lines during the pre-charge period of bit lines are performed in the dRAM of FIG. 1.
Figure 3B:
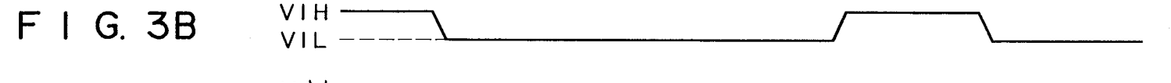
Figure 3C:
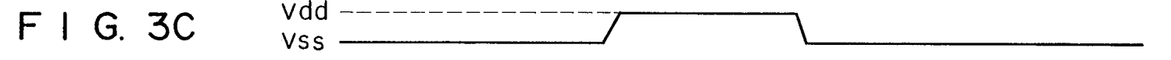
Figure 3D:
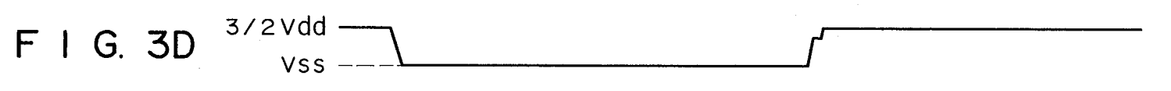
Figure 3E:
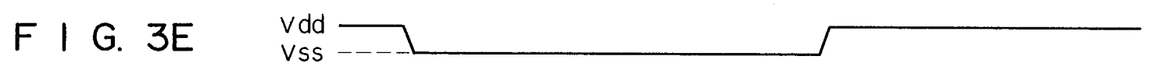
Figure 3F:
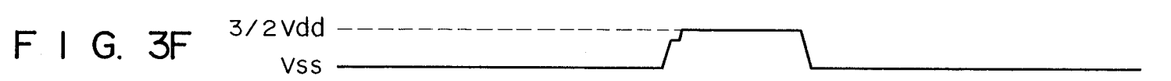
Figure 3G:
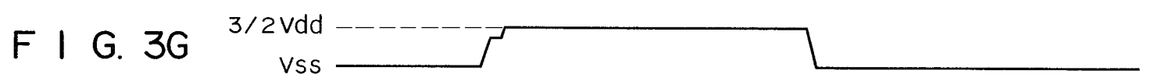
Figure 3H:
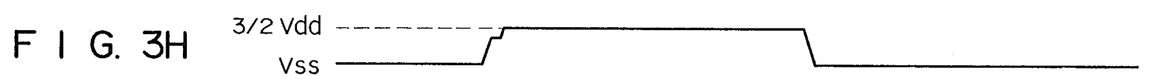

In this state, as shown in FIG. 3A, when an RAS (row address strobe) signal falls from a high level voltage VIH to a low level voltage VIL before a change in level occurs at a column address strobe signal (CAS) signal, the potential of the pre-charge clock line K3 falls from the voltage 3/2 Vdd to the voltage Vss, as shown in FIG. 3D. Simultaneously, the potential of the dummy cell clock signal K4 falls from the voltage Vdd to the voltage Vss, as shown in FIG. 3E. In response to the change in potential of the line K3, the FETs Q7 to Q11 are simultaneously disabled, thereby stopping pre-charging of the bit lines Bi and Bi'. In response to a change in potential of the line K4, the FETs Q14 and Q15 are disabled and the dummy cell capacitor nodes N2 and N3 are insulated from the ground potential Vss.

Thereafter, for example, the memory cell word line MW1 and the dummy cell word line DW2 are selected. When the potential of the lines MW1 and DW2 rises from the voltage Vss to the voltage 3/2 Vdd, as shown in FIGS. 3G and 3H, the MOSFETs Q16 and Q13 which are included in the cells MC1 and DC1 connected to the lines MW1 and DW2 are rendered conductive. The capacitors C5 and C4 are electrically connected to the bit lines Bi and Bi' through the conductive MOSFETs Q16 and Q13, respectively. Therefore, electrical storage contents of the capacitors C5 and C4 are transferred onto the bit lines Bi and Bi'.

Figure 3I:
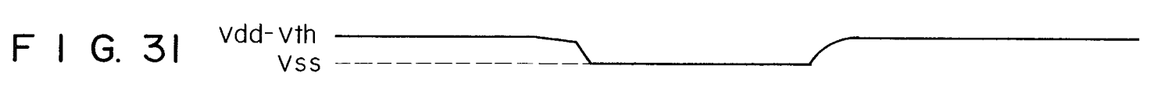
Figure 3J:
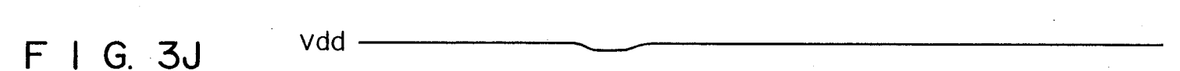
Figure 3K:
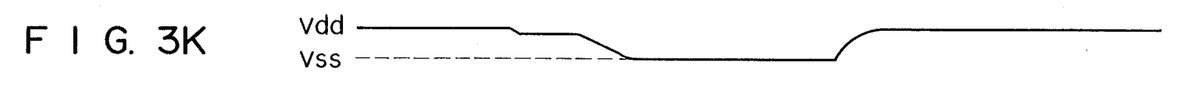

Thereafter, the sense clock signal supplied to the clock line K1 for the sense-amplifier 10 gradually drops from a voltage difference between the voltages Vdd and Vth (indicated by "Vdd−Vth" in FIG. 3I), to the ground potential Vss, as shown in FIG. 3I. Thus, the sense-amplifier 10 is activated. FIGS. 3J and 3K show changes in the potential of bit lines Bi and Bi'. When the sense-amplifier 10 is activated, the potential of the bit line Bi', which completes voltage transfer in the dummy cell DC2, drops from the potential Vdd to the ground potential Vss, as shown in FIG. 3K. The potential of the bit line Bi, which reads out the "1" data from the memory cell MC1, is held at Vdd. At this time, the potential of the bit line Bi falls slightly and temporarily due to coupling and racing, with respect to the bit line Bi' as shown in FIG. 3J. However, this change in level is soon recovered, and the potential of the bit line Bi is constantly maintained at the voltage Vdd. This is because the clock signal supplied to the clock line K2, which is connected to the pull-up circuit 12, rises from the voltage Vss to the voltage Vdd, as shown in FIG. 3C, to start the pull-up operation of the circuit 12. Upon start of the active pull-up operation of the circuit 12, the FET Q5 is rendered conductive, thereby supplying the voltage Vdd to the bit line Bi through the FET Q5.

Figure 3L:
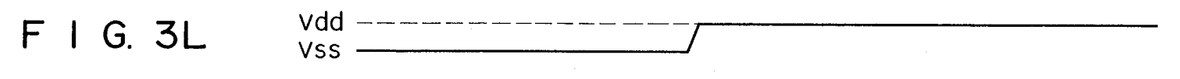
Figure 3M:
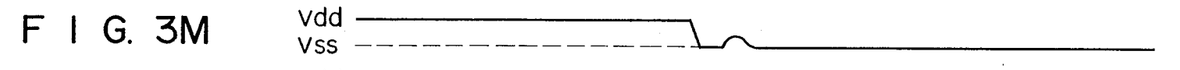

After the potential changes from the voltage Vss to the voltage Vdd in response to the clock signal K2, as shown in FIG. 3C, the transfer gate clock signal supplied to the clock line K5, which is connected to the first gate transfer section 30, rises from the voltage Vss to the voltage 3/2 Vdd, as shown in FIG. 3F. Thus, the transfer gate FETs Q20 and Q21 are rendered conductive, and the first transfer gate 20-i is set in an "open" state. As a result, the bit lines Bi and Bi' are electrically connected to the node lines Ai and Ai', respectively. The readout data potentials appearing on the bit lines Bi and Bi' are transferred to the node lines Ai and Ai'. Thus, the potential of the lines Ai and Ai' is changed, as shown in FIGS. 3L and 3M. That is, the potential of the node line Ai, which is connected to the bit line Bi (i.e., the memory cell MC1), is changed from the ground potential Vss to the power supply voltage Vdd, as shown in FIG. 3L. The potential of the line Ai', which is connected to the bit line Bi' (i.e., the dummy cell DC2), is changed from the voltage Vdd to the voltage Vss, as shown in FIG. 3M. The potentials of these lines, after the drop in potential, are statically held by the static flip-flop circuit.

The other latch memory cells (i.e., the static memory cells 20-1, 20-2, ... shown in FIG. 1) are operated in the same manner as described above. Therefore, the potentials of all the memory cells connected to the designated memory cell word line (in this case, the line MW1) and those of the dummy cells connected to the dummy cell word line (in this case, the line DW2) are transferred to and held in the node line pairs A and A' of the corresponding latch memory cells. In other words, the storage contents of all the memory cells connected to a designated memory cell word line are statically stored in the corresponding latch memory cells 20-1, 20-2, ..., 20-i, ....

Figure 3N:
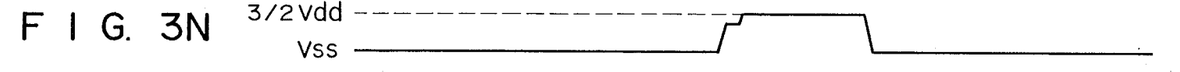
Figure 3O:
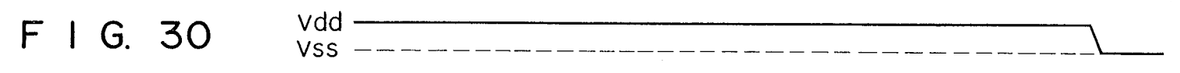
Figure 3P:
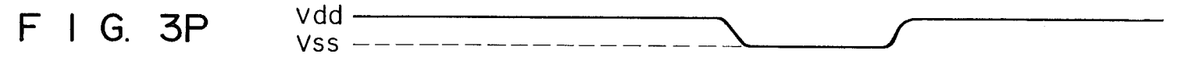
Figure 3Q:
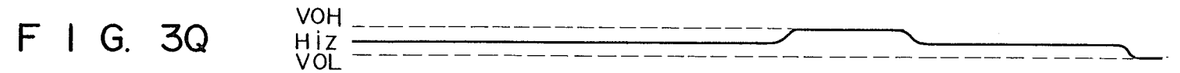

When the column select signal supplied to the column select line CSi is changed from the voltage Vss to the voltage 3/2 Vdd so as to select the ith bit line pair Bi and Bi', as shown in FIG. 3N, the transfer gate FETs Q24 and Q25 provided along the node line pair Ai and Ai', which are connected to the line pair Bi and Bi', are rendered conductive, and the second transfer gate 40-*i* is set in the "open" state. Therefore, the lines Ai and Ai' are electrically conducted to the input/output lines 50 and 50' through the FETs Q24 and Q25. The data potentials of the lines Ai and Ai' are transferred to the lines 50 and 50', respectively. Therefore, the potential of the line 50 is kept at Vdd, as shown in FIG. 3O, and the potential of the line 50' falls from Vdd to Vss, as shown in FIG. 3P. Thus, output data Dout is generated through the lines 50 and 50' in response to data readout so as to have logic "high" level VOH, as shown in FIG. 3Q. It should be noted that while the lines Bi and Bi' are connected to the lines 50 and 50', data read/write can be performed without its having been through the latch memory cell 20 (as in the conventional manner).

Thereafter, when the CAS signal rises from the voltage VIL to the voltage VIH, as shown in FIG. 3B, the potential at the lines MW1 and DW2 falls from 3/2 Vdd to Vss (see FIGS. 3F, 3G and 3H). Then, the FETs Q20 and Q21 of the gate 30 become nonconductive, thereby electrically disconnecting the bit line pair Bi and Bi' and the node line pair Ai and Ai'. The latch memory cell 20 is electrically separated from the lines Bi and Bi'. In this state, when the pre-charge clock signal K3 is changed from voltage Vss to the voltage 3/2 Vdd, as shown in FIG. 3D, pre-charging of the bit lines is initiated. It should be noted that during the pre-charging operation, the static memory cell 20 is kept separated from the lines Bi and Bi', and the potential at the lines Ai and Ai' is statically held by the flip-flop circuit.

Figure 3R:
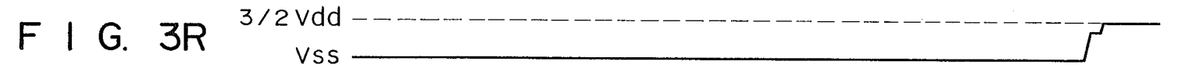
Figure 3S:
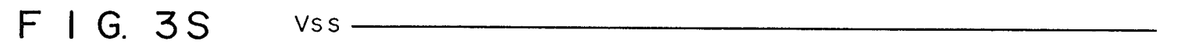
Figure 3T:
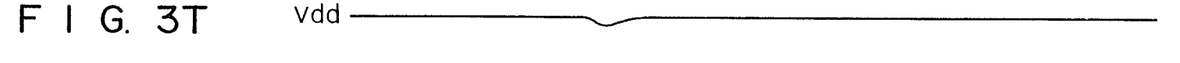

A case will be described wherein the CAS signal falls from the high voltage 3/2 Vdd to the low voltage Vss again, and another bit line pair (not shown but referred to as the jth bit line pair) is selected. In this case, a select signal changing from the voltage Vss to the voltage 3/2 Vdd, as shown in FIG. 3R, is supplied to the Jth bit lines. Latch memory cells (not shown) provided for the jth bit lines statically store data voltages corresponding to the storage content of memory and dummy cells connected to the selected word lines MW1 and DW2 and the jth bit lines. Therefore, during the pre-charging operation the data voltage held in the jth latch memory cell can be transferred to the input/output lines 50 and 50'.

Figures 4A, 4B, 4C:
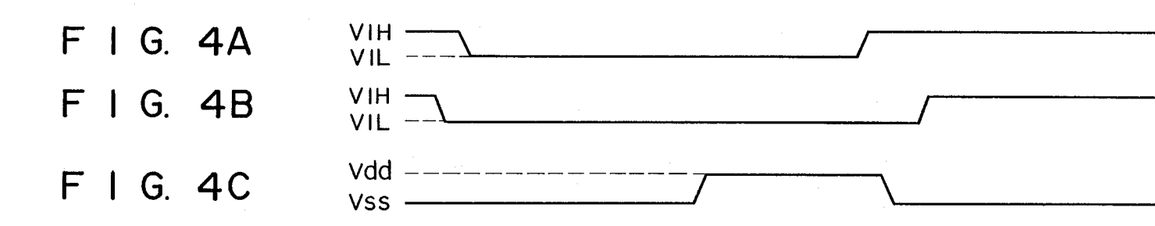
FIGS. 4A to 4T are waveform charts showing electrical signals which are generated from main parts or supplied thereto when data held in a specific latch memory cell is written in the corresponding memory cell in the dRAM of FIG. 1, and which correspond respectively to the signals shown in FIGS. 3A to 3T.
Figure 4D:
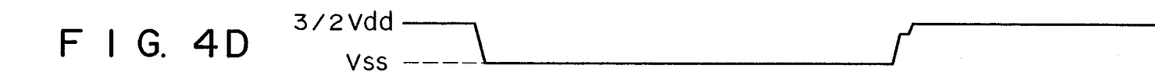
Figures 4E, 4F:
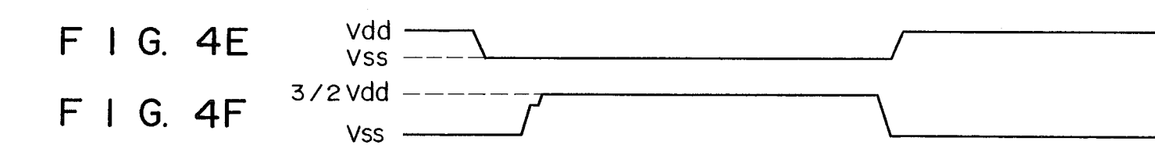
Figure 4G:
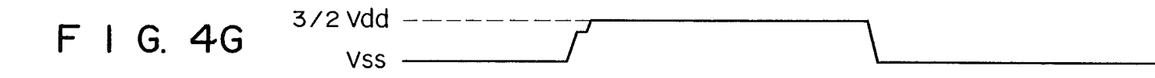
Figure 4H:
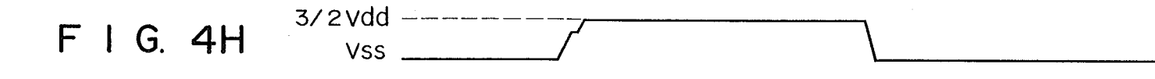
Figure 4I:
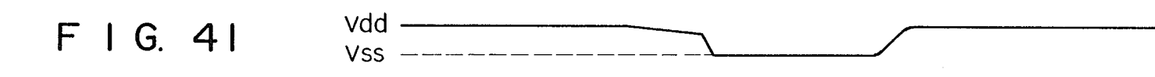
Figure 4J:
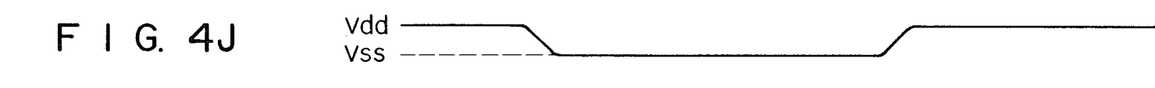
Figure 4K:
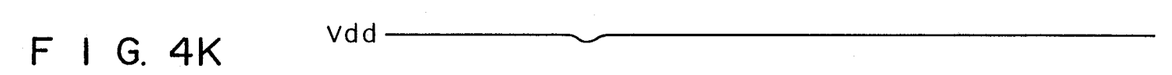
Figure 4L:
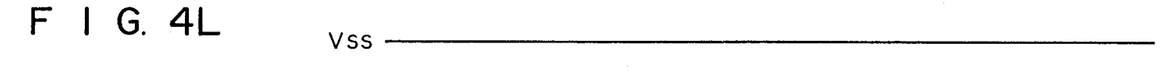
Figure 4M:
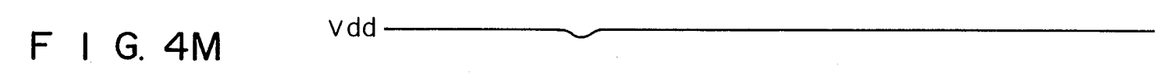
Figure 4N:
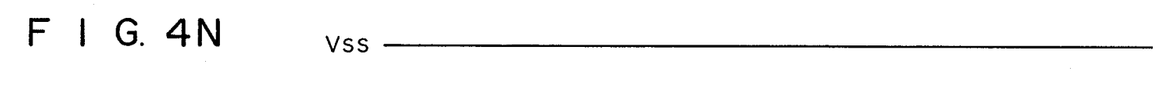
Figure 4O:
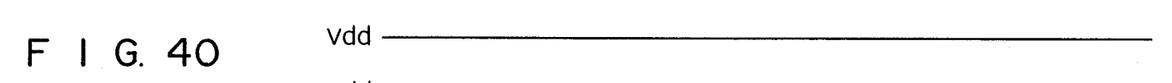
Figure 4P:
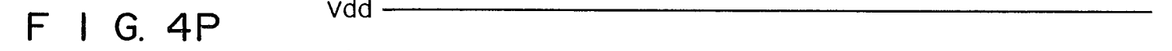
Figure 4Q:
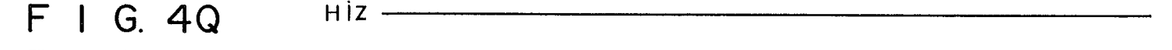
Figure 4R:
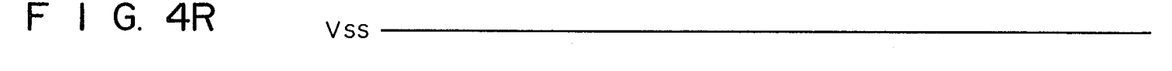
Figure 4S:
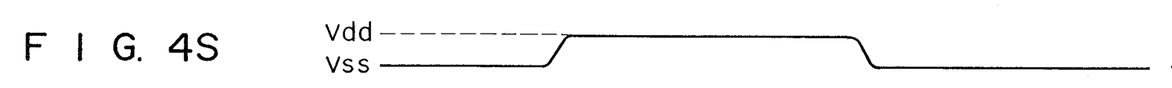
Figure 4T:
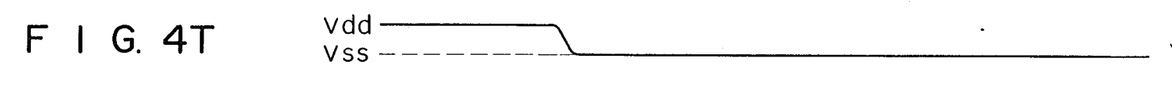

An operation for writing data stored in a desired latch memory cell into the corresponding memory cell during the pre-charging operation of the bit lines will be described with reference to FIGS. 4A to 4T. FIGS. 4A to 4T are waveform charts of electrical signals generated from the main parts of the dRAM of the embodiment when data held in the specific latch memory cell is to be written in the corresponding memory cell in the dRAM. FIGS. 4A to 4T correspond to FIGS. 3A to 3T. FIGS. 4A and 4B show waveforms of the RAS and CAS signals. FIGS. 4C to 4F show waveforms of the clock signals supplied to the clock lines K2 to K5. FIGS. 4G and 4H show changes in potential of the memory cell word line MW1 and the dummy cell word line DW2. FIG. 4I shows a waveform of the clock signal supplied to the clock line K1 which is connected to the sense-amplifier 10. FIGS. 4J and 4K show changes in potential of the ith bit line pair Bi and Bi'. FIGS. 4L and 4M show changes in potential of the node line pair Ai and Ai' of the latch memory cell connected to the lines Bi and Bi'. FIG. 4N shows the waveform of the column select signal CSLi. FIGS. 4O and 4P show changes in potential of the input/output line pair 50 and 50'. FIG. 4Q shows an output data potential. FIG. 4R shows the waveform of a column select signal CSLj (not shown in FIG. 2) supplied to the jth bit line pair. FIGS. 4S and 4T show changes in potential of the capacitor nodes N2 and N1 of the dummy cell DC2 and the memory cell MC1 which are connected to the ith bit line pair.

As shown in FIGS. 4A and 4B, when the CAS signal is changed from a high potential (VIH) to a low potential (VIL) prior to the RAS signal, the pre-charge clock signal K3 falls from the voltage 3/2 Vdd to the voltage Vss (see FIG. 4D), thereby electrically floating the bit lines. Simultaneously, since the potential of the dummy cell clock K4 falls from Vdd to Vss in the same manner as in the data readout mode, as shown in FIG. 4E, the FETs Q14 and Q13 are rendered nonconductive. Therefore, the nodes N2 and N3 of the capacitors are insulated from the ground potential. Before the potentials of the word lines MW1 and DW2 rise from the voltage Vss to the voltage 3/2 Vdd, as shown in FIGS. 4G and 4H, the potential of the transfer gate drive clock signal K5 is changed from the voltage Vss to the voltage 3/2 Vdd, as shown in FIG. 4F. Thus, the first transfer gate 30-*i* is set in the "open" state, and the latch memory cell 20-*i* is electrically connected to the bit lines Bi and Bi'.

The latch memory cell 20 can statically store the data of the previously selected memory cell MC1 continuously even during the pre-charge period of the bit lines. When the FETs Q20 and Q21 included in the first transfer gate section 30 are rendered conductive in response to the transfer gate drive clock signal K5, the potentials of the node lines Ai and Ai' of the latch memory cell (see FIGS. 4L and 4M) are transferred to the corresponding ith bit line pair Bi and Bi' through the transfer gate 20-*i*. As a result, the potential level of the bit line Bi falls from the voltage Vdd to the voltage Vss, as shown in FIG. 4J, and at the same time, the potential level of the bit line Bi' is continuously held at the power supply voltage Vdd, as shown in FIG. 4K.

Thereafter, when the word lines MW1 and DW2 are selected, a logical value corresponding to the voltage Vss, transferred from the node line Ai of the latch memory cell 20 to the bit line Bi, is written in the memory cell capacitor C5 even during the pre-charge period of the bit lines. As a result, as shown in FIGS. 4S and 4T, the potentials of the nodes N2 and N1 are changed. During this interval, the lines 50 and 50' are constantly kept at the voltage Vdd (see FIGS. 4O and 4P), and the output data potential is kept at an intermediate potential Hiz between logic "1" level and logic "0" level (see FIG. 4Q). During the above-mentioned operation, the ith column select signal CSLi and the other column select signal CSLj are constantly held at the potential Vss (see FIGS. 4N and 4R).

According to the dRAM with the auxiliary static cells of the present invention, storage data of all the memory cells connected to a selected memory word line are supplied to the corresponding latch memory cells (20), and are statically held thereby. Such static data storage in the latch memory cells is continuously performed until the next word line is designated. Therefore, during the pre-charge period of the bit lines, performed in the above operation, if storage data in another memory cell must be read out from the memory cells connected to the selected word line, the latch memory cell corresponding to the certain memory cell can be designated so as to read out the data therefrom. If necessary, accessing of storage data of the latch memory cell can be repeated even in the pre-charge period until the next word line is designated. As for the memory cells connected to the selected word line, data accessing therebetween is not limited to the pre-charging operation, and can be repeated a desired number of times. Therefore, data access speed of the dRAM can be greatly improved.

Furthermore, according to the present invention, data stored in the latch memory cell once can be rewritten, as needed in a corresponding memory cell even in the pre-charge period of the bit lines. As a result, operation speed in the data write mode can also be improved.

Although the present invention has been shown and described with reference to particular embodiments, various changes and modifications which are obvious to a person skilled in the art and to which the invention pertains are deemed to lie within the scope of the invention.

For example, in the above embodiment, the folded bit line configuration has been exemplified. However, the present invention can be applied to a dRAM of an open end bit line configuration. As well, the present invention can also be applied to a static RAM.

What is claimed is:

1. A dynamic semiconductor memory device comprising:
   (a) bit lines extending parallel to each other;
   (b) a plurality of word lines provided substantially perpendicular to said bit lines;
   (c) dynamic memory cells provided at intersections of said bit lines and said word lines;
   (d) auxiliary memory cell means connected to said bit lines, for statically storing data voltages supplied thereto;
   (e) data input/output lines;
   (f) sense-amplifier means connected to said bit lines, for sensing and amplifying, in a data access mode of said memory device, a data voltage stored in a selected dynamic memory cell which is connected to a specific word line; and
   (g) transfer gate means connected to said bit lines, said auxiliary memory cell means and said data input/output lines, for transferring data voltages stored in dynamic memory cells which are connected to said specific word line to said auxiliary memory cell means, and for, during a pre-charge period, electrically connecting said auxiliary memory cell means with said data input/output lines, whereby any one of said data voltages can be read out to said input/output lines even during the pre-charge period, wherein said transfer gate means includes a first transfer gate circuit means connected between said bit lines and said auxiliary memory cell means, for electrically connecting said bit lines and said auxiliary memory cell means in the data access mode, and for disconnecting said auxiliary memory cell means from said bit lines, and said transfer gate means further including second transfer gate means connected between said auxiliary memory cell means and said data input/output lines, for electrically connecting said auxiliary memory cell means with said data input/output lines in the pre-charge mode, thereby allowing any one of said data voltages stored in said auxiliary memory cell means to be read out to said data input/output lines.

2. The device according to claim 1, wherein said auxiliary memory cell means comprises:
   an array of static memory cells respectively connected to said bit lines, each of said static memory cells comprising static flip-flop circuit.

3. The device according to claim 2, wherein said bit lines have first ends to which said sense-amplifier means is connected, and second ends to which said static memory cells are connected through said first transfer gate circuit means.

4. The device according to claim 3, wherein said first and second transfer gate circuit means comprise switching transistors.

5. The device according to claim 4, wherein each of said dynamic memory cells comprises a switching transistor and a capacitor.

* * * * *